United States Patent [19]

Strang et al.

[11] Patent Number: 5,572,406
[45] Date of Patent: Nov. 5, 1996

[54] ELECTRICAL RECEPTACLE ASSEMBLY WITH ENHANCED HEAT DISSIPATION ARRANGEMENT

[75] Inventors: Ward E. Strang, Fairfield; Carol Z. Howard, Oxford; Thomas M. McDonald, Monroe, all of Conn.

[73] Assignee: Hubbell Incorporated, Orange, Conn.

[21] Appl. No.: 557,735

[22] Filed: Nov. 13, 1995

[51] Int. Cl.$^6$ .................................................. H05K 7/20
[52] U.S. Cl. ..................... 361/707; 174/16.3; 361/690; 361/715; 361/825; 361/730; 439/487; 439/539; 439/650; 439/620
[58] Field of Search .............................. 174/16.3, 50, 58; 361/690, 704, 707, 712–713, 722, 728, 730, 736, 752, 825, 831, 715, 717–718; 439/106–107, 535, 538, 539, 620, 650, 485, 487

[56] References Cited

U.S. PATENT DOCUMENTS

| | | | |
|---|---|---|---|
| 4,872,081 | 10/1929 | Murphy et al. | 361/736 |
| 4,872,087 | 10/1989 | Brant | 361/730 |
| 5,281,154 | 1/1994 | Comerci et al. | 361/487 |

*Primary Examiner*—Gregory D. Thompson
*Attorney, Agent, or Firm*—Jerry M. Presson; Michael R. Swartz

[57] ABSTRACT

An electrical receptacle assembly with an enhanced heat dissipation arrangement includes a housing having a front side with plug contact receiving openings and a rear side spaced from the front side, a circuitboard mounted in the housing between the front and rear sides thereof and spaced from the rear side, a plurality of varistors mounted to the circuitboard and disposed between the circuitboard and the rear side of the housing, and a mounting bridge fitted over the exteriors of the rear side and top and bottom ends of the housing for mounting the housing to an outlet box and providing a heat sink for dissipating from the housing heat generated by the varistors. The varistors are mounted to the circuitboard in the housing on the front side thereof opposite to the rear side where the electrical components are mounted to the circuitboard. The varistors have leads which are bent into G-shaped configurations so that portions of the leads extend from the front side to the rear side of the circuitboard around the peripheral edge thereof so as to place the varistors along the rear side of the circuitboard adjacent to the interior rear side of the housing in close proximity to the mounting bridge for rapid heat dissipation and remote from electrical components mounted on the front side of the circuitboard. A heat barrier plate made of heat-retardant material is positioned between the varistors and rear side of the circuitboard to impede heat produced by the varistors from reaching and impinging upon the circuitboard. The leads of the varistors also extend around the periphery of the barrier plate.

17 Claims, 4 Drawing Sheets

ELECTRICAL RECEPTACLE ASSEMBLY WITH ENHANCED HEAT DISSIPATION ARRANGEMENT

CROSS REFERENCE TO RELATED APPLICATION

Reference is hereby made to the following copending U.S. application dealing with subject matter related to the present invention: "Electrical Receptacle Assembly With Interference Fitting And Latching Parts" by Carol Z. Howard et al, assigned U.S. Ser. No. 08/331,981 and filed Oct. 31, 1994 now U.S. Pat. No. 5,484,309.

BACKGROUND OF THE INVENTION

1. Field of the Invention

The present invention generally relates to electrical equipment and, more particularly, is concerned with an electrical receptacle assembly employing components in an enhanced heat dissipation arrangement.

2. Description of the Prior Art

Heretofore, single and duplex electrical receptacles manufactured and marketed by Hubbell Incorporated of Orange, Connecticut, the assignee of the subject application, have employed a generally rectangular housing with plug contact receiving openings formed on its front side and a generally U-shaped "wrap-around" mounting bridge positioned adjacent the rear side of the housing and extending vertically therealong and forwardly therefrom along top and bottom ends of the housing. The mounting bridge at a back portion is in contact with the rear side of the housing. Also, the mounting bridge has upper and lower mounting tabs attached to and extending respectively upwardly and downwardly from front ends of opposite upper and lower end portions of the mounting bridge. The upper and lower mounting tabs have eyelets defined therethrough for fastening the bridge to a receptacle or outlet box, which is attached to a building wall, by the use of screws inserted through the upper and lower eyelets and threaded into the box.

One specific group of electrical receptacles, manufactured and marketed by the assignee of the subject application, are called surge suppression receptacles. These receptacles are typically used with voltage transient sensitive electronic equipment, such as computers and the like, which need steady uninterrupted A.C. power in order to function properly. The suppression of overvoltages or spikes frequently received by these receptacles is provided by the use of voltage clamping devices, which may take the form of one or more metal oxide varistors (MOVs). The varistors are incorporated in a circuit provided in the receptacle between the utility power connection wires and the plug-in contacts of the receptacle. The circuit is normally not affected by the presence of the varistors. However, in the instance when a voltage transient above the MOVs voltage rating is encountered, the varistors absorb the excess power and thereby instantaneously reduce or clamp down the voltage of the A.C. power, allowing only a safe, acceptable level thereof to pass through the receptacle to the electronic equipment.

The absorption of excess electrical power by the varistors causes them to increase in temperature. Typically, the varistors are mounted to a circuitboard in the receptacle on a side of the circuitboard where other electrical components are mounted and opposite from a reverse side where solder connections are made between circuit paths thereon and the ends of the leads of the components extending through the circuitboard. As their temperatures increase, the varistors will conduct heat to the circuitboard and radiate heat to adjacent electrical components. Established requirements pertaining to thermal stress on devices containing varistors intended for suppression of surge conditions provide that the heat generated by the varistors must be dissipated in some manner. Heretofore, the plastic material of the receptacle housing also functioned as a heat sink to dissipate excess heat generated by the varistors. However, the receptacle housing has not been entirely satisfactory for this purpose. Heretofore, the "wrap-around" mounting bridge which, as mentioned above, is used on single and duplex electrical receptacles as the means to attach the receptacle to an outlet box, had not been incorporated by the specific group of receptacles which had the added function of surge suppression.

Consequently, a need still exists for improvements in the design and construction of an electrical surge suppression receptacle assembly which will provide improved dissipation of heat from the varistors thereof.

SUMMARY OF THE INVENTION

The present invention provides an electrical receptacle assembly designed to satisfy the aforementioned needs. The electrical receptacle assembly of the present invention employs its components in an arrangement which enhances the dissipation of heat generated by the varistors used in the assembly.

Accordingly, the present invention is directed to an electrical receptacle assembly with an enhanced heat dissipation arrangement. The electrical receptacle assembly comprises: (a) a housing having a front side with plug contact receiving openings, a rear side spaced from the front side, and opposite top and bottom ends spaced from one another and extending between and interconnecting the front and rear sides; (b) a circuitboard mounted in the housing between the front and rear sides thereof and spaced from the rear side; (c) at least one and preferably two or more varistors mounted to the circuitboard and disposed between the circuitboard and the rear side of the housing; and (d) a mounting bridge fitted over exteriors of the rear side and of the top and bottom ends of the housing for mounting the housing to an outlet box, for grounding of the assembly, and for providing of a heat sink for dissipating heat from the housing which is generated by the varistors.

The mounting bridge has a back portion extending along the rear side of the housing. Also, the mounting bridge has upper and lower end portions connected to the back portion and extending forwardly therefrom respectively along the top and bottom ends of the housing. The upper and lower end portions of the mounting bridge have respective means for facilitating the fastening of the mounting bridge to the outlet box.

The varistors are mounted to the circuitboard in the housing on one side of the circuitboard opposite to another side thereof where electrical components are mounted to the circuitboard. The one side of the circuitboard is where connections are made between circuit paths thereon and the leads of the circuitboard components extending through the circuitboard. The leads of the varistors are bend into a G-shaped configuration so that portions of the leads extend from a front side to a rear side of the circuitboard around the peripheral edge thereof so as to place the varistors along the rear side of the circuitboard adjacent to the interior rear side of the housing in close proximity to the back portion of the mounting bridge and remote from electrical components mounted on the front side of the circuitboard.

Also, the electrical receptacle assembly comprises a barrier plate made of flame-retardant insulating material positioned between the varistors and the rear side of the circuitboard to further impede heat produced by the varistors from reaching and impinging upon the circuitboard. The leads of the varistors also extend around the periphery of the barrier plate.

These and other features and advantages and attainments of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the course of the following detailed description, reference will be made to the attached drawings in which.

DETAILED DESCRIPTION OF THE INVENTION

Figure 1:
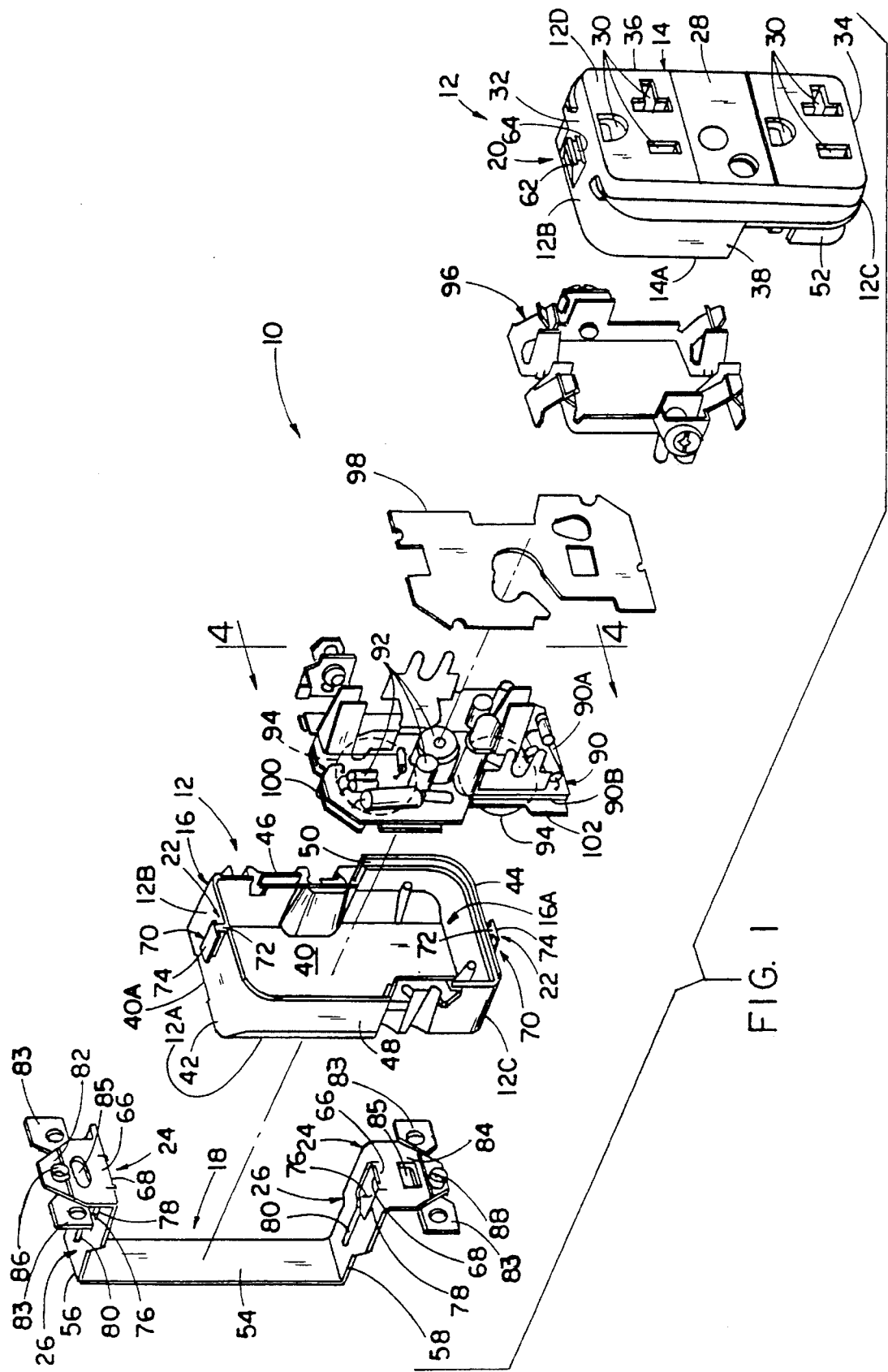
FIG. 1 is an exploded perspective view of an electrical receptacle assembly of the present invention employing an enhanced heat dissipation arrangement in accordance with the present invention.

In the following description, like reference characters designate like or corresponding parts throughout the several views. Also in the following description, it is to be understood that such terms as "forward", "rearward", "left", "right", "upwardly", "downwardly", and the like, are words of convenience and are not to be construed as limiting terms.

Figure 2:
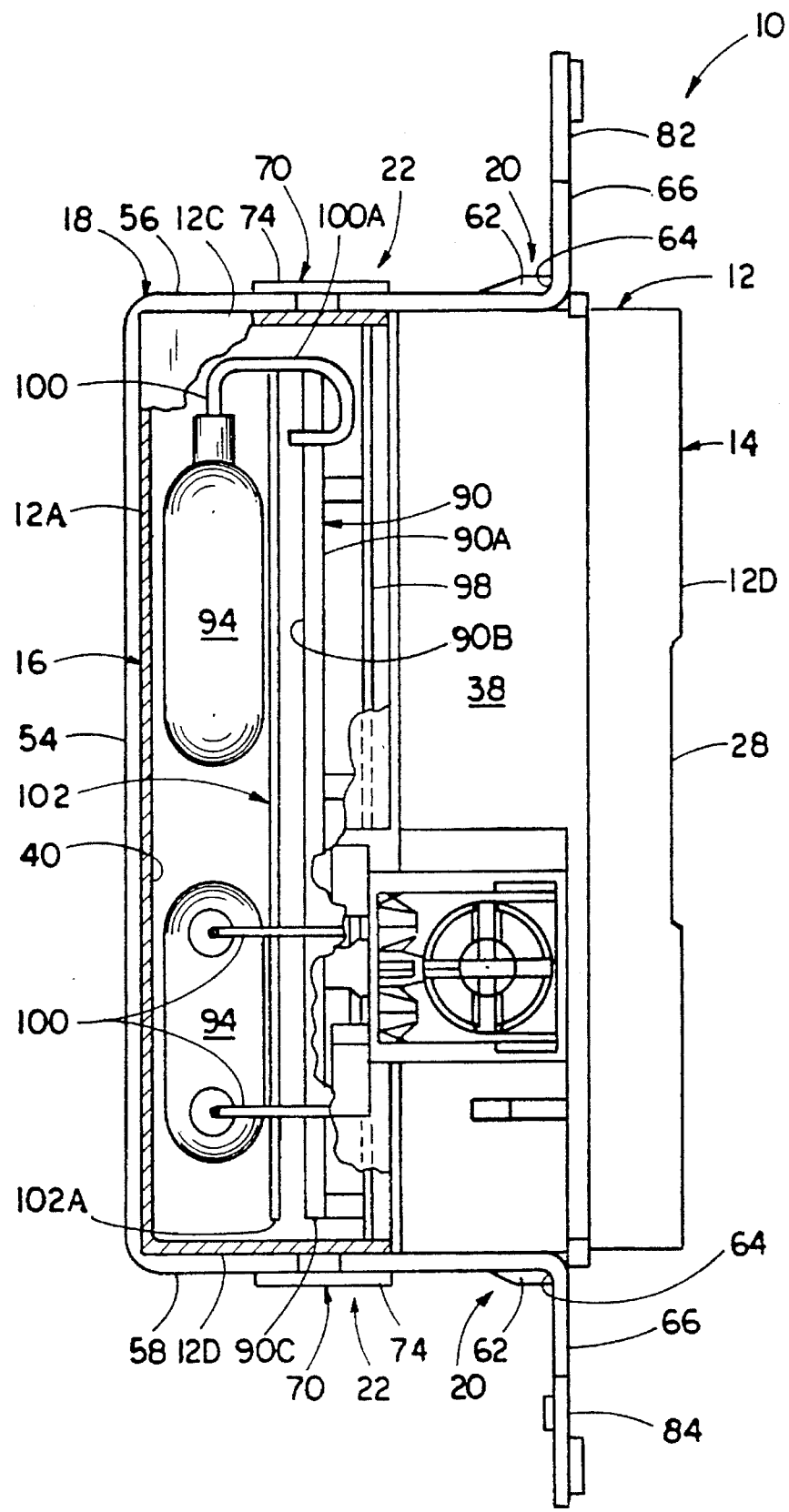
FIG. 2 is an enlarged side elevational view of the electrical receptacle assembly in an assembled form and with parts of the receptacle housing broken away.
Figure 3:
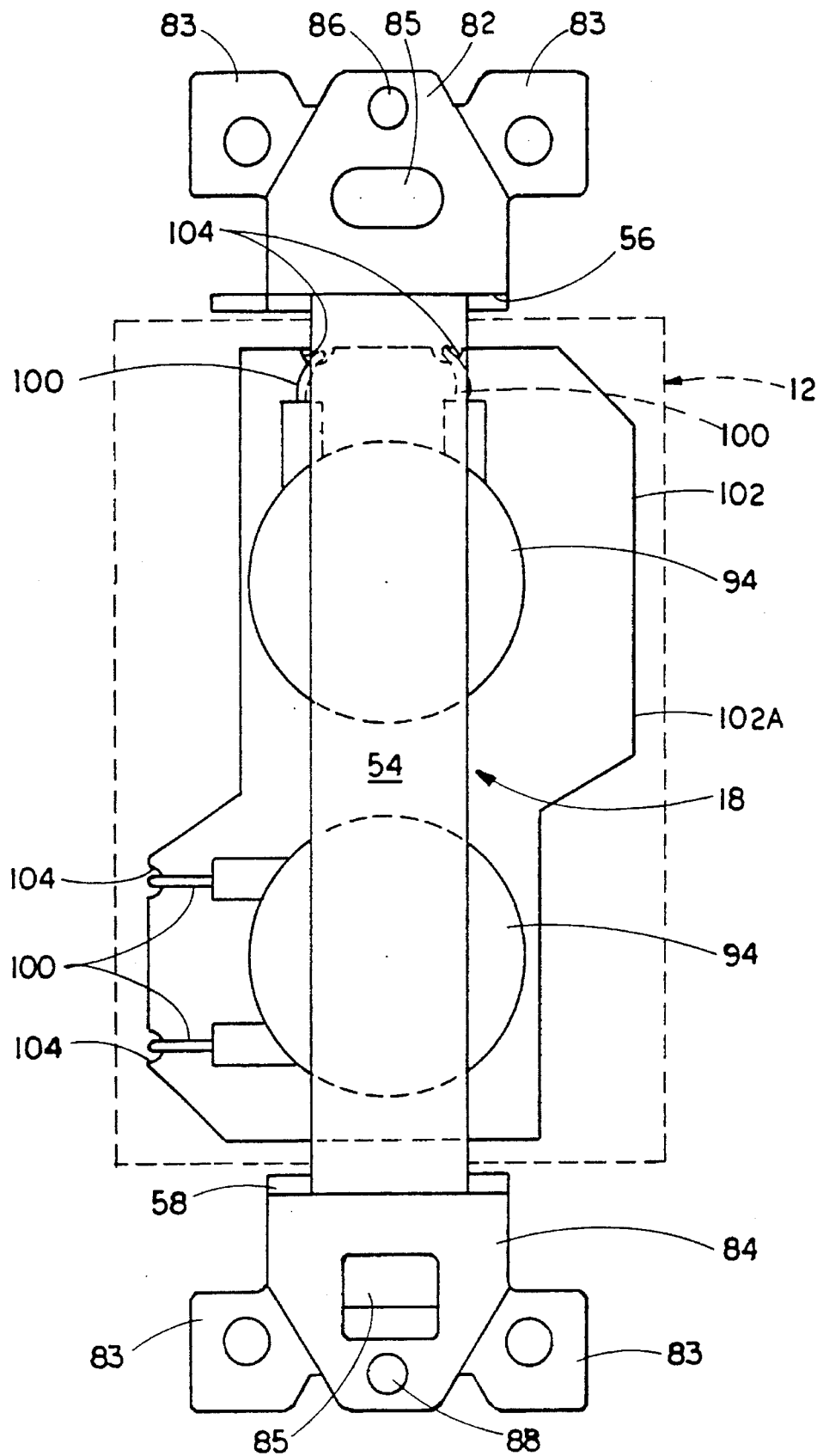
FIG. 3 is an enlarged rear elevational view of the mounting bridge, varistors and flame-retardant insulating barrier plate of the assembly with the rear side of the housing being shown in dashed outline form.

Referring now to the drawings, and particularly to FIGS. 1 and 2, there is illustrated an electrical receptacle assembly of the present invention, generally designated 10. The principles of the present invention employed by the electrical receptacle assembly 10 can be used in electrical receptacles for various applications. The application illustrated in the drawings is an electrical receptacle for a surge suppressor unit or the like.

Basically, the electrical receptacle assembly 10 includes a generally rectangular two-piece housing 12 having a front cover 14 and a back cover 16. The back cover 16 is separate from and mateable with the front cover 14. The assembly 10 also includes a mounting bridge 18 which fits over a rear side 12A and opposite top and bottom ends 12B, 12C of the housing 12 formed by the mated front and back covers 14, 16. The assembly 10 further includes a plurality of first, second, third and fourth pairs of securement elements 20, 22, 24 and 26 which are employed to secure the front and back covers 14, 16 together by use of the mounting bridge 18. These features form the invention which is the subject of the patent application cross-referenced above; however, these features will be described hereinafter for the purpose of providing a complete and thorough understanding of the present invention.

More particularly, the front cover 14 of the housing 12 includes a front wall 28 defining a front side 12D of the housing 12 and having various plug contact receiving slots 30 defined therethrough. The front cover 14 also has a pair of top and bottom end walls 32, 34 attached to and extending rearwardly and outwardly from the front wall 28, and a pair of opposite side walls 36, 38 attached to and extending rearwardly and outwardly from the front wall 28 and extending between the top and bottom end walls 32, 34. The rear cover 16 of the housing 12 includes a solid rear wall 40 defining the rear side 12A of the housing 12, a pair of top and bottom end walls 42, 44 attached to and extending forwardly and outwardly from the rear wall 40, and a pair of opposite side walls 46, 48 attached to and extending forwardly and outwardly from the rear wall 40 and extending between the top and bottom end walls 42, 44. The back cover 16 has a narrow interior recess 50 formed in and extending along the front peripheral edges of the top and bottom end walls 42, 44 and of the side walls 46, 48 which define an open front end 16A in the back cover 16. The front cover 14 has a narrow exterior recess 52 formed in and extending along the rear peripheral edges of the top and bottom end walls 32, 34 and of the side walls 36, 38 which define an open rear end 14A in the front cover 14. Due to the presence of the respective recesses 50, 52, the back cover 16 at its front end 16A is mateable with and unmatable from the front cover 14 at its rear end 14A.

The mounting bridge 18 of the assembly 10 has a generally U-shaped configuration providing its "wrap-around" capability relative to the housing 12. The mounting bridge 18 includes a base or back portion 54 and a pair of opposite upper and lower end or leg portions 56, 58 fitted over the exteriors of the rear side 12A and the top and bottom ends 12B, 12C of the housing 12. More particularly, the base portion 54 extends along an exterior surface 40A of the rear wall 40 of the back cover 16 and between a pair of laterally spaced ribs (not shown) formed on the exterior surface 40A of the rear wall 40 and extending between the top and bottom end walls 42, 44. The upper and lower leg portions 56, 58 are attached to and extend outwardly from opposite ends of the base portion 54 so as to overlie the respective top and bottom end walls 32, 34 and 42, 44 of the mated front and back covers 14, 16 of the housing 12.

The first and second pairs of securement elements 20, 22 are defined on the respective opposite top and bottom end walls 32, 34 and 42, 44 of the front and back covers 14, 16, while the third and fourth pairs of securement elements 24, 26 are defined on the opposite upper and lower leg portions 56, 58 of the mounting bridge 18. In the exemplary form shown in the drawings, the first securement elements 20 which are defined on the respective top and bottom end walls 32, 34 of the front cover 14 each takes the form of a wedge-shaped ramp 62 extending in inclined relation above and below the respective one of the top and bottom end walls 32, 34 and having a front lip 64 formed thereon protruding forwardly therefrom and being spaced above and below the respective one of the top and bottom end walls 32, 34. The wedge-shaped ramps 62 with the front lips 64 are substantially identical in configuration to one another. The third securement elements 24 which are defined on the opposite upper and lower leg portions 56, 58 of the mounting bridge 18 each takes the form of a flange 66 extending above and below the respective one of the upper and lower leg portions 56, 58 and having a ledge 68 formed thereon protruding rearwardly therefrom and spaced above and below the respective one of the upper and lower leg portions 56, 58 so as to underlie and interfit with the respective one of the front lips 64 of the ramps 62 when the front and back covers 14, 16 are mated with one another and located between the upper and lower leg portions 56, 58 of the mounting bridge 18.

Also in the exemplary form shown in the drawings, the second securement elements 22 which are defined on the respective top and bottom end walls 42, 44 of the back cover 16 each takes the form of a T-shaped projection 70 having a neck portion 72 attached to and extending outwardly from the respective one of the top and bottom end walls 42, 44 and a flat head portion 74 fixed on and extending transverse to the outer end of the neck portion 72. The T-shaped projections 70 are substantially identical in configuration to one another. The fourth securement elements 26 which are defined on upper and lower leg portions 56, 58 of the mounting bridge 18 each takes the form of a key-hole shaped opening 76 having first and second portions 78, 80 with the first portion 78 being larger in size than the second portion 80 of the opening 76. The first portion 78 of the opening 76 is also larger in length and width than the head portion 74 of the respective T-shaped projection 70 so as to receive the respective one of the T-shaped projections 70 therethrough. The second portions 80 of the opening 76 being narrower in width than the first portion 78 and the head portion 74 of the T-shaped projection 70 but wider in width than the neck portion 72 thereof is thereby adapted to slidably receive and retain the respective one of the T-shaped projections 70 in interfitting relation with and along the respective one of the upper and lower leg portions 54, 56 of the mounting bridge 18 when the back cover 16 is located between the upper and lower leg portions 56, 58.

The front and back covers 14, 16 are preferably fabricated as rigid structures molded from a suitable plastic, whereas the mounting bridge 18 is fabricated of a substantially rigid metal but the base portion 54 is sufficiently resiliently springable to allow the upper and lower leg portions 56, 58 to be temporarily forced away from one another. To assemble the front and back covers 14, 16 to the mounting bridge 18, the upper and lower leg portions 56, 58 of the mounting bridge 18 are forced slightly away from one another so as to allow the back cover 16 to be fitted therebetween with the T-shaped projections 70 extending through the first portions 78 of the key-hole shaped openings 76 therein. The back cover 16 can then be slid rearwardly to bring its rear wall 40 into contact with the base portion 54 of the mounting bridge 18 and the T-shaped projections 70 into interfitted relationship with the narrow second portions 80 of the openings 76. Then, the upper and lower leg portions 56, 58 of the mounting bridge 18 are again forced slightly away from one another by forcing the front cover 14 between them with the ramps 62 thereon engaging the bottoms of the flanges 66 of the third securement elements 24. Once the front lips 64 on the ramps 62 have moved rearwardly past the ledges 68 on the flanges 66, a snap-fitted or latched connection is thereby secured between the front cover 14 and the upper and lower leg portions 56, 58 of the mounting bridge 18. By again forcing apart from one another the upper and lower leg portions 56, 58 of the mounting bridge 18, the front and rear covers 14, 16 can be uncoupled from the mounting bridge 18.

From the foregoing description of the securement elements 22, 24, 26, 28, it can be readily understood that selected ones of the first, second, third and fourth pairs of securement elements 20, 22, 24, 26 are interference fittable and latchable with one another for securing the mated front and back covers 14, 16 of the housing 12 to the mounting bridge 18. Furthermore, the pairs of securement elements 20, 22, 24, 26 can be releasably coupled together and decoupled apart without the use of any tools.

Also, the mounting bridge 18 has upper and lower mounting tabs 82, 84 attached to and extending respectively upwardly and downwardly from front ends of opposite upper and lower end portions 56, 58 of the mounting bridge 18. The upper and lower mounting tabs 82, 84 have eyelets 85 defined therethrough for fastening the mounting bridge 18 and therewith the housing 12 to an outlet box (not shown), attached to a building wall, by the use of screws (not shown) inserted through the eyelets 85 and received by corresponding threaded openings (not shown) in the outlet box (not shown). The mounting tabs 82, 84 of bridge 18 are also provided with break-off washers 83 to assist in mounting the assembly 10 to the outlet box (not shown) and with respective upper and lower threaded eyelets 86, 88 for attaching a coverplate (not shown) to the assembly. Thus, it is readily seen that the main function of the mounting bridge 18 is to mount the receptacle assembly to the outlet box in addition to its function of providing electrical grounding of the assembly.

Referring to FIGS. 1–5, in accordance with the principles of the present invention, the electrical receptacle assembly 10 includes an improved arrangement for enhancing the dissipation of heat from the housing 12. In such an arrangement, the mounting bridge 18 serves or provides another function, that being, as a heat sink for dissipating heat from the housing 12.

In addition to the components described above, the electrical receptacle assembly 10 includes a circuitboard 90 mounted in the housing 12 between and spaced from the rear and front sides 12A, 12D thereof, a plurality of conventional electrical components 92 mounted to the circuitboard 90 and disposed between a front side 90A of the circuitboard 90 and the front wall 28 of the front cover 14 which is the front side 12D of the housing 12, and at least one and preferably two or more voltage transient absorbing varistors 94 mounted to the circuitboard 90 and disposed between a rear side 90B of the circuitboard 90 and the rear wall 40 of the rear cover 16 which is the rear side 12A of the housing 12. It should be understood that even though a pair of varistors 94 are shown, the present invention includes the use of only one varistor as well as the use of several varistors. Also, the assembly 10 includes a contact assembly 96 and insulator 98 disposed between the circuitboard 90 and front wall 28 of the front cover 14 of the housing. The contact assembly 96 aligns with the plug contact receiving slots 30 in the front wall 28 of the front cover 14 for mating with the contacts of a plug when plugged into the electrical receptacle assembly 10.

Figure 4:
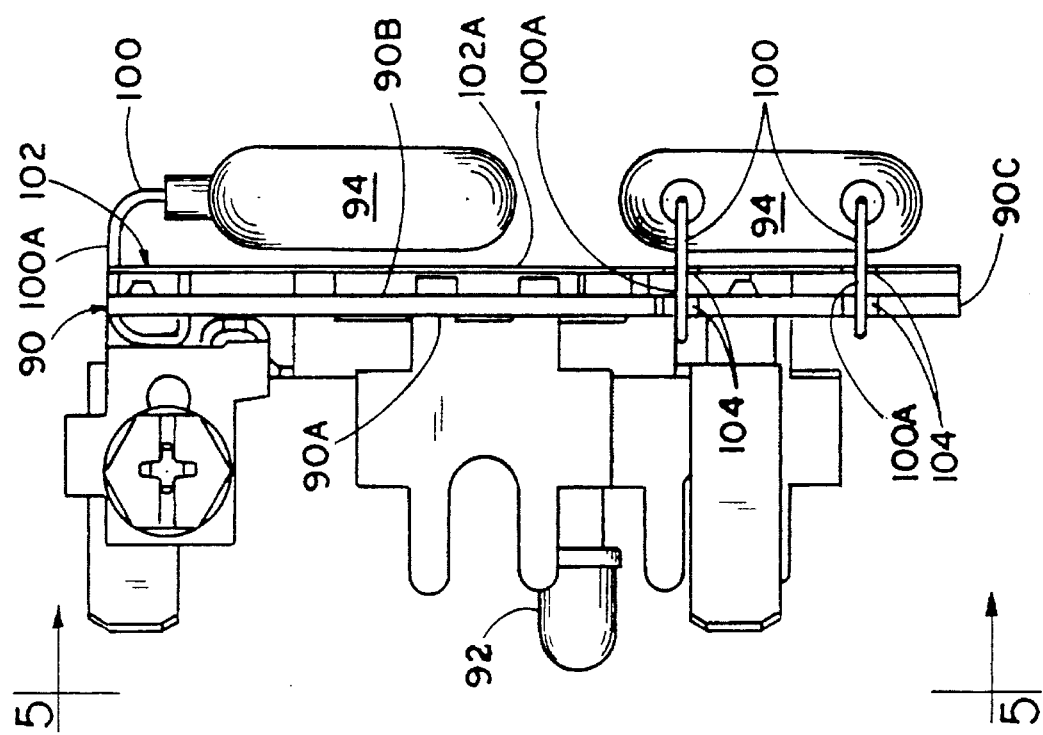
FIG. 4 is a side elevational view of a circuitboard of the assembly and the varistors and other electrical components mounted thereto as seen along line 4—4 of FIG. 1.
Figure 5:
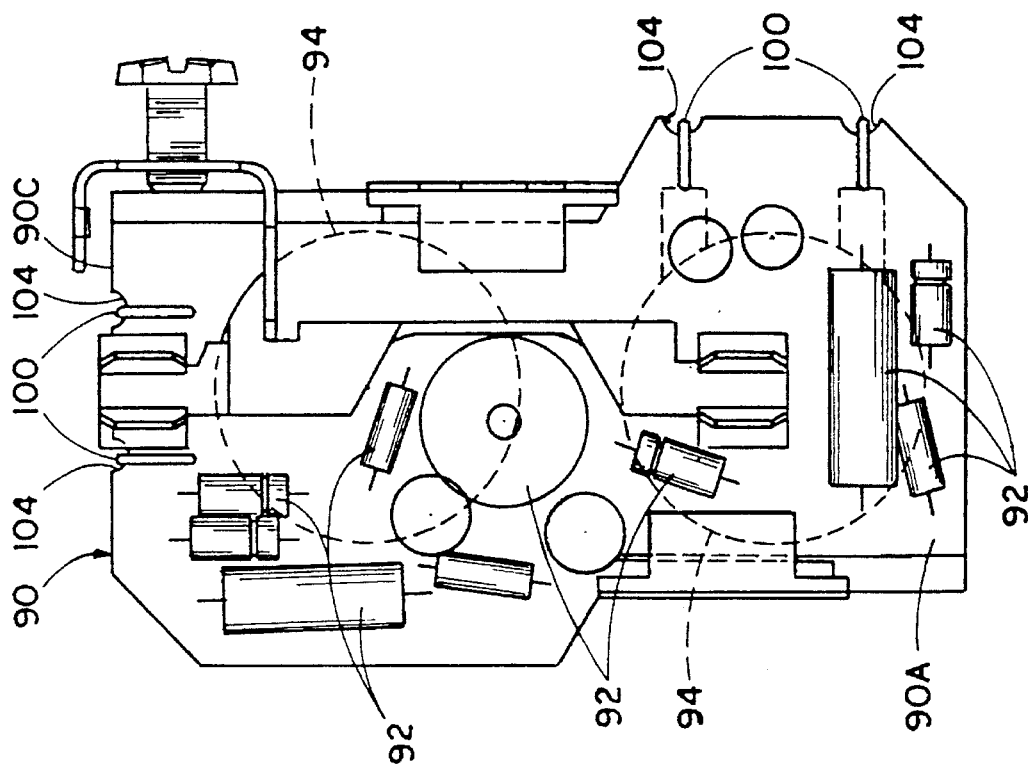
FIG. 5 is a front elevational view of circuitboard of the assembly as seen along line 5—5 of FIG. 4.

The varistors 94 have elongated leads 100 by which they are connected and mounted to the front side 90A of the circuitboard 90 along with the other electrical components 92. The rear side 90B of the circuitboard 90 has a pattern of circuit paths formed thereon to which connections are made between the circuit paths and the leads 100 of the varistors 94 and the terminals or leads of the other circuitboard components 92 extending through the circuitboard 90. As best seen in FIGS. 2 and 4, each of the leads 100 of the varistors 94 is bent preferably into a G-shaped configuration so that portions 100A of the leads 100 will extend from the front side 90A to the rear side 90B of the circuitboard 90 around the peripheral edge 90C thereof so as to place the varistors 94 along the rear side 90B of the circuitboard 90 closely adjacent to the interior of the rear side 12A of the housing 12 in close proximity to the base portion 54 of the mounting bridge 18 and thus remote from the other electrical components 92 mounted to the front side 90A of the circuitboard 90. As can be realized from FIG. 2, by being disposed between the circuitboard 90 and the rear wall 40 of the rear cover 16 of the housing 12, the varistors 94 are sufficiently close to the base portion 54 of the mounting bridge 18 so as to permit the mounting bridge 18 to effectively provide the function of a heat sink for receiving the heat produced by the varistors 94 via the rear wall 40 and the base portion 54 of the mounting bridge 18 and dissipating the heat from the housing 12. Further, as can be readily appreciated, the closer the varistors 94 are located to the base portion 54 of the mounting bridge 18, the more readily will the heat be dissipated.

Also, the electrical receptacle assembly 10 includes a barrier plate 102 made of a suitable flame-retardant insulating material positioned between the varistors 94 and the rear side 90B of the circuitboard 90 to further impede heat produced by the varistors 94 from reaching and impinging upon the circuitboard 90. The leads 100 of the varistors 94 also extend around the periphery 102A of the barrier plate 102. The barrier plate 102 preferably has a profile similar to that of the circuitboard 90 and both have recesses 104 formed at selected portions of their peripheries 90C, 102A to accommodate the portions 100A of the leads 100 of the varistors 94 passing around the peripheries 90C, 102A of the circuitboard 90 and barrier plate 102.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely preferred or exemplary embodiments thereof.

We claim:

1. An electrical receptacle assembly, comprising:
   (a) a housing having a front side with plug contact receiving openings, and a rear side spaced from said front side;
   (b) a circuitboard mounted in said housing between said front and rear sides thereof and spaced from said rear side;
   (c) at least one varistor mounted to said circuitboard and disposed between said circuitboard and said rear side of said housing; and
   (d) a mounting bridge fitted over said rear side of said housing for mounting said housing to an outlet box and for providing a heat sink for dissipating from said housing heat generated by said varistor.

2. The assembly as recited in claim 1, wherein said mounting bridge has a back portion extending along said rear side of said housing.

3. The assembly as recited in claim 2, wherein said housing also has opposite top and bottom ends spaced from one another and extending between and interconnecting said front and rear sides of said housing.

4. The assembly as recited in claim 3, wherein said mounting bridge also has upper and lower end portions connected to said back portion and extending forwardly therefrom respectively along said top and bottom ends of said housing, said upper and lower end portions of said mounting bridge having respective means for facilitating the fastening of said mounting bridge to the outlet box.

5. The assembly as recited in claim 1, wherein said circuitboard has a front side facing toward said front side of said housing, a rear side facing toward said rear side of said housing, and electrical components and said varistor being mounted to said front side of said circuitboard, said varistor having leads being bent so that portions thereof extend around a peripheral edge of said circuitboard from said front side to said rear side thereof so as to place said varistor along said rear side of said circuitboard adjacent to and interiorly of said rear side of said housing and remote from the electrical components mounted on said front side of said circuitboard.

6. The assembly as recited in claim 5, wherein said leads of said varistor are bent into G-shaped configurations.

7. The assembly as recited in claim 5, further comprising:
   (e) a heat barrier plate positioned between said varistor and said rear side of said circuitboard to impede heat produced by said varistor from reaching and impinging upon said circuitboard.

8. The assembly as recited in claim 7, wherein said heat barrier plate is made of a flame-retardant insulating material.

9. The assembly as recited in claim 5, wherein said leads of said varistor also extend around a periphery of said heat barrier plate.

10. The assembly as recited in claim 1, further comprising:
    (e) a heat barrier plate positioned between said varistor and said rear side of said circuitboard to impede heat produced by said varistor from reaching and impinging upon the circuitboard.

11. The assembly as recited in claim 10, wherein said heat barrier plate is made of a flame-retardant insulating material.

12. An electrical receptacle assembly, comprising:
    (a) a housing having a front side with plug contact receiving openings, a rear side spaced from said front side, and opposite top and bottom ends spaced from one another and extending between and interconnecting said front and rear sides;
    (b) a circuitboard mounted in said housing between said front and rear sides thereof and spaced from said rear side;
    (c) at least one varistor mounted to the circuitboard and disposed between said circuitboard and said rear side of said housing;
    (d) a heat barrier plate positioned between said varistor and said rear side of said circuitboard to impede heat produced by said varistor from reaching and impinging upon said circuitboard; and
    (e) a mounting bridge fitted over exteriors of said rear side and of said top and bottom ends of said housing for mounting said housing to an outlet box and for providing a heat sink for dissipating from said housing heat generated by said varistor.

13. The assembly as recited in claim 12, wherein said mounting bridge includes:
    a back portion extending along said rear side of said housing; and
    a pair of upper and lower end portions connected to said back portion and extending forwardly therefrom respectively along said top and bottom ends of said housing, said upper and lower end portions of said mounting bridge having respective means for facilitating the fastening of said mounting bridge to the outlet box.

14. The assembly as recited in claim 12, wherein said circuitboard has a front side facing toward said front side of said housing, a rear side facing toward said rear side of said housing, and electrical components and said varistor being mounted to said front side of said circuitboard, said varistor having leads being bent so that portions thereof extend around a peripheral edge of said circuitboard from said front side to said rear side thereof so as to place said varistor along said rear side of said circuitboard adjacent to and interiorly of said rear side of said housing in close proximity to said mounting bridge and remote from the electrical components mounted on said front side of said circuitboard.

15. The assembly as recited in claim 14, wherein said leads of said varistor are bent into G-shaped configurations.

16. The assembly as recited in claim 14, wherein said leads of said varistor also extend around a periphery of said barrier plate.

17. The assembly as recited in claim 12, wherein said barrier plate is made of a flame-retardant material.

* * * * *